United States Patent
Wu et al.

(10) Patent No.: US 10,204,809 B2
(45) Date of Patent: Feb. 12, 2019

(54) METHOD FOR THERMAL TREATMENT USING HEAT RESERVOIR CHAMBER

(71) Applicants: Semiconductor Manufacturing International (Beijing) Corporation, Beijing (CN); Semiconductor Manufacturing International (Shanghai) Corporation, Shanghai (CN)

(72) Inventors: Qiang Wu, Shanghai (CN); Huayong Hu, Shanghai (CN); Deping Kong, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/404,672

(22) Filed: Jan. 12, 2017

(65) Prior Publication Data

US 2017/0133251 A1 May 11, 2017

Related U.S. Application Data

(62) Division of application No. 14/805,956, filed on Jul. 22, 2015, now Pat. No. 9,576,828.

(30) Foreign Application Priority Data

Jul. 22, 2014 (CN) .......................... 2014 1 0350605

(51) Int. Cl.
*H01L 21/00* (2006.01)
*H01L 21/67* (2006.01)
(Continued)

(52) U.S. Cl.
CPC ...... *H01L 21/67248* (2013.01); *H01L 21/324* (2013.01); *H01L 21/67109* (2013.01);
(Continued)

(58) Field of Classification Search
CPC ............. H01L 21/67248; H01L 21/324; H01L 21/67115; H01L 22/20
See application file for complete search history.

(56) References Cited

U.S. PATENT DOCUMENTS 8,343,280 B2  1/2013  Iimuro Shunichi

FOREIGN PATENT DOCUMENTS

CN  103077917 A  5/2013

OTHER PUBLICATIONS

Machine translation of CN 103077917, May 2018.*

* cited by examiner

*Primary Examiner* — Richard A Booth
(74) *Attorney, Agent, or Firm* — Anova Law Group, PLLC

(57) ABSTRACT

The present disclosure provides a thermal treatment chamber. The thermal treatment chamber includes a wafer holder to hold a to-be-processed wafer; a heat reservoir located under the wafer holder, but being separated from the wafer holder, for adjusting a temperature of the wafer holder based on the to-be-processed wafer; and a first driving unit connected to the heat reservoir for adjusting a distance between the wafer holder and the heat reservoir to adjust the temperature of the wafer holder.

18 Claims, 2 Drawing Sheets

(51) Int. Cl.
*H01L 21/324* (2006.01)
*H01L 21/66* (2006.01)
*H05B 1/02* (2006.01)

(52) U.S. Cl.
CPC ........ *H01L 21/67115* (2013.01); *H01L 22/20* (2013.01); *H05B 1/0233* (2013.01)

METHOD FOR THERMAL TREATMENT USING HEAT RESERVOIR CHAMBER

CROSS REFERENCE TO RELATED APPLICATIONS

This application is a divisional of U.S. patent application Ser. No. 14/805,956, filed on Jul. 22, 2015, which claims the priority of Chinese patent application No. CN201410350605.3, filed on Jul. 22, 2014, the entire contents of all of which are incorporated herein by reference.

FIELD OF THE INVENTION

The present invention generally relates to the field of semiconductor manufacturing technology and, more particularly, relates to a heat reservoir chamber and a method for thermal treatment.

BACKGROUND

In semiconductor integrated circuit manufacturing processes, a photoresist layer is often formed on a semiconductor substrate and photolithography is used to define regions for etching or ion implantation. The photoresist layer is removed after the etching or ion implantation processes are completed.

In an existing photolithography technology, the photoresist layer is usually formed in a coating apparatus. To form a photoresist layer, a wafer is transported to the coating apparatus, and a layer of photoresist is spin coated on the surface of the wafer. The wafer with the spin-on photoresist layer is transported to a thermal treatment chamber or a hot plate for thermal treatment or soft bake process to evaporate some of the solvent in the photoresist layer. Then the wafer is transported to a cooling plate to cool down after the thermal treatment.

An existing thermal treatment chamber or hotplate is shown in FIG. 1. The thermal treatment chamber includes a wafer holder 100, a heat reservoir 101 in the wafer holder, temperature sensing units 102 embedded in the wafer holder 100, and an exhaust unit 104 above the wafer holder 100.

The wafer holder 100 may be configured to hold a wafer 103 for the thermal treatment. The heat reservoir 101 may be configured to provide thermal treatment for the wafer holder 100. The temperature sensing units 102 may be configured to detect surface temperature of the wafer holder 100. The exhaust unit 104 may be configured to vent waste gas in the thermal treatment chamber.

Before the wafer is thermally treated, the temperature of the thermal treatment chamber (e.g., the wafer holder) needs to be set to a determined value. However, due to the differences in fabrication processes and product types, the requirement to treat one specific type of photoresist layer or a photoresist layer with a specific thickness is different from another. Thus, the thermal treatment temperature for treating different types of photoresist on a wafer varies accordingly. That is, the thermal treatment temperature in the chamber needs to be adjusted for photoresist of different fabrication processes and product types. When there is a difference between the set temperature value and the real-time temperature, a temperature adjustment is needed to increase/decrease the real-time temperature for it to match the set temperature value.

However, in existing thermal treatment chambers, the time to increase or decrease the chamber temperature may often be too long or it may be difficult to control the chamber temperature.

BRIEF SUMMARY OF THE DISCLOSURE

The present disclosure is set forth to solve the problem of, for example, how to improve the heating/cooling rate of the heat treatment chamber, and other problems.

One aspect of the present disclosure provides a thermal treatment chamber. The thermal treatment chamber includes a wafer holder to hold a to-be-processed wafer; a heat reservoir located under the wafer holder, but being separated from the wafer holder, for adjusting a temperature of the wafer holder based on the to-be-processed wafer; and a first driving unit connected to the heat reservoir for adjusting a distance between the wafer holder and the heat reservoir to adjust the temperature of the wafer holder.

Another aspect of the present disclosure further provides a thermal treatment method. The thermal treatment method includes providing a thermal treatment chamber having a wafer holder to hold a to-be-processed wafer, a heat reservoir positioned under the wafer holder but separated from the wafer holder for adjusting a temperature of the wafer holder, and a first driving unit connected to the heat reservoir for adjusting a distance between the wafer holder and the heat reservoir to adjust the temperature of the wafer holder; setting a temperature of the wafer holder to be a set temperature value; and placing the to-be-processed wafer on the wafer holder. The thermal treatment method also includes obtaining a real-time temperature of the wafer holder after the to-be-processed wafer is placed on the wafer holder; and obtaining a difference between the real-time temperature of the wafer holder and the set temperature value for adjusting the distance between the heat reservoir and the wafer holder until the real-time temperature is equal to the set temperature value.

Other aspects of the present disclosure may be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

In an existing thermal treatment chamber, increasing or decreasing the chamber temperature may take an undesirably long time. Specifically, it can take up to a few minutes for an existing thermal treatment chamber to cool down. As a result, the utilization of the coating apparatus may be undesirably low and the yield of the coating apparatus may decrease. In addition, when a thermal treatment is being performed in an existing thermal treatment chamber, because the temperature of the wafer is low (about 22 to about 25 degrees Celsius), the temperature of the wafer holder may be lowered by the wafer when a wafer, with a photoresist layer, is placed on the wafer holder at the beginning of a thermal treatment process. This may cause the temperature of the wafer holder to fluctuate such that the accuracy of the thickness and the uniformity of the surface features of the photoresist layer may be adversely affected.

It has been found that the heat reservoir in a thermal treatment chamber is often a resistive heater. The heat reservoir can generate heat when a voltage is applied on the heat reservoir. The distance between the heat reservoir and the wafer holder may be fixed, and the temperature of the wafer holder in the thermal treatment chamber may be controlled/adjusted by adjusting the temperature of the heat reservoir. For example, when the wafer holder needs to be cooled down, the cooling can only be obtained by decreasing the temperature of the heat reservoir or by natural cooling. Thus, the cooling process may be undesirably long.

The present disclosure provides a thermal treatment chamber or hotplate. The thermal treatment chamber includes a wafer holder and a heat reservoir under the wafer holder. The heat reservoir may be moved away from or towards the wafer holder by being driven by a first driving unit, such that increasing or decreasing the temperature of the wafer holder may be obtained not only by adjusting the temperature of the heat reservoir, but also by adjusting the distance between the heat reservoir and the wafer holder. Therefore, the time for increasing/decreasing the temperature of the wafer holder may be greatly shortened.

Figure 1:
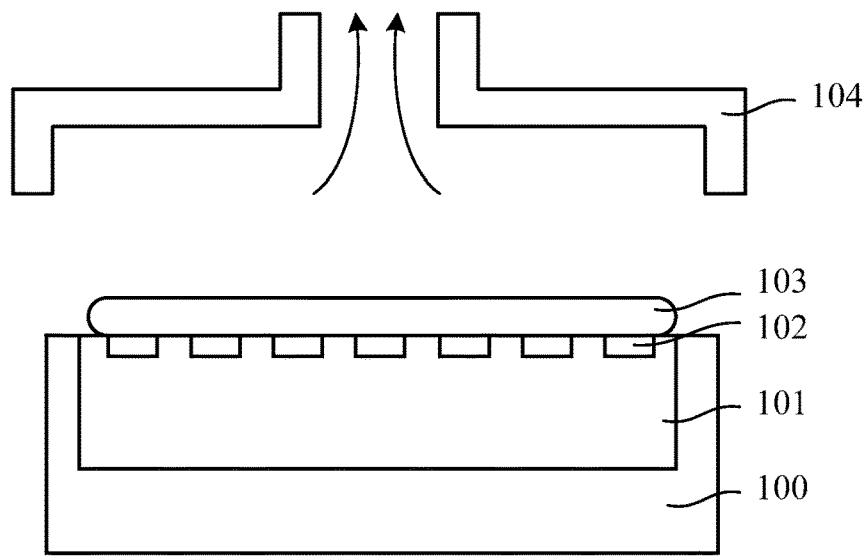
FIG. 1 illustrates structure of an existing thermal treatment chamber.
Figure 2:
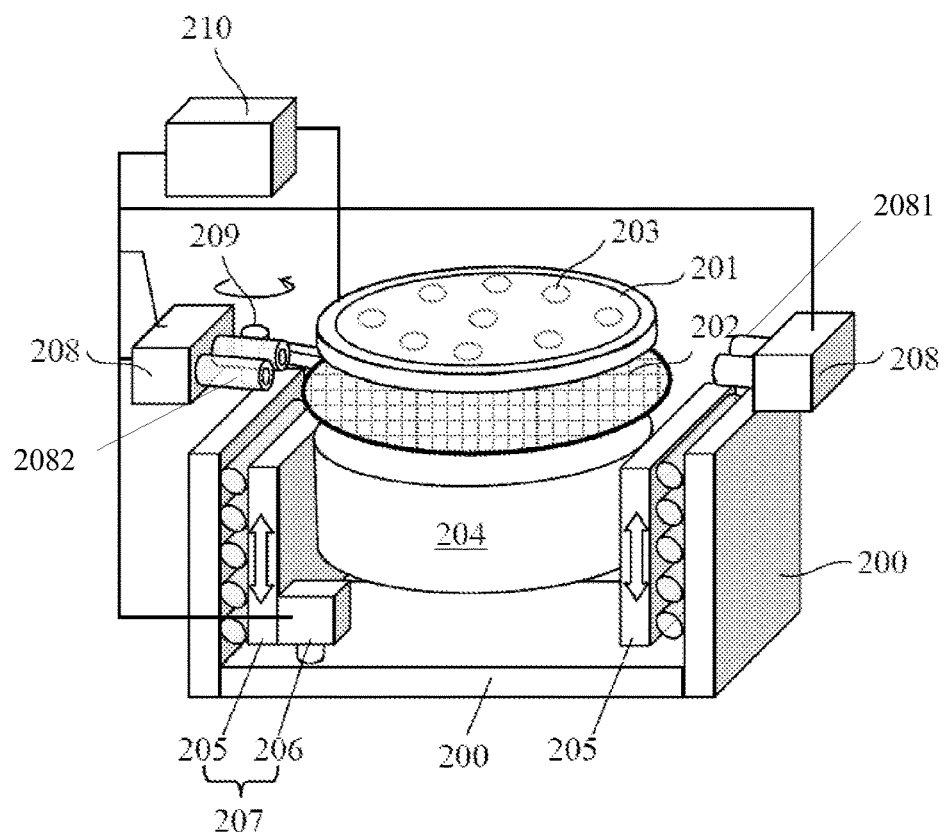
FIGS. 2 and 3 illustrate structures of an exemplary embodiment of the thermal treatment chamber consistent with the present disclosure.
Figure 3:
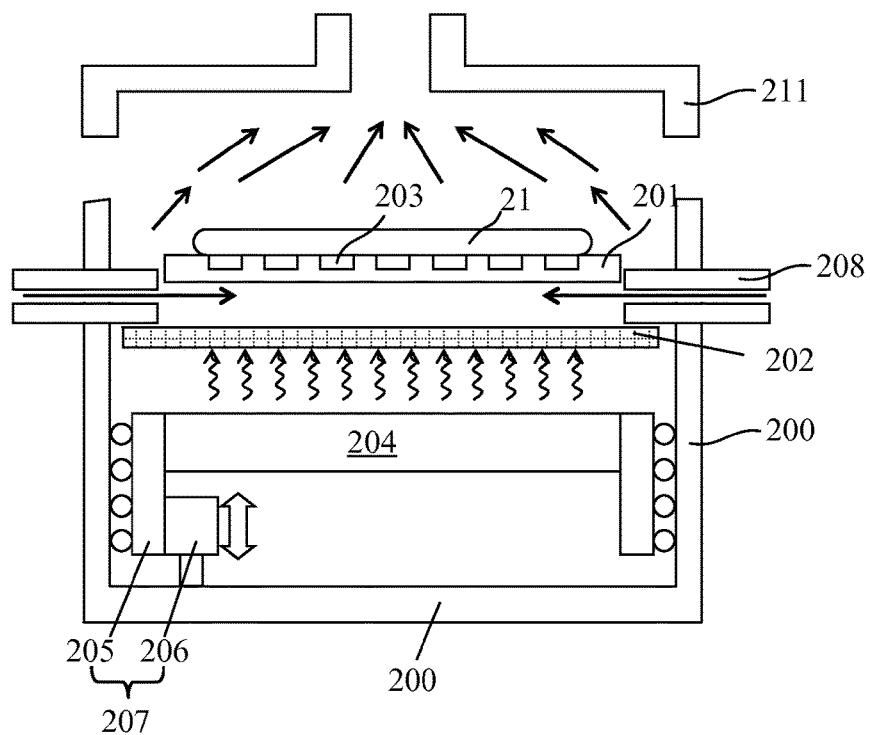

FIGS. 2 and 3 illustrate the structure of an exemplary thermal treatment chamber consistent with the present disclosure. FIG. 2 illustrates an overall structure of the exemplary thermal treatment chamber, and FIG. 3 illustrates a cross-sectional view of the exemplary thermal treatment chamber.

The thermal treatment chamber shown in FIG. 2 may include a wafer holder 201 to hold the wafer being thermally treated, and a heat reservoir 204 located under the wafer holder 201 to provide thermal treatment for the wafer holder 201. The thermal treatment chamber may further include a first driving unit 207 connected to the heat reservoir 204 to drive the heat reservoir 204 to move away from or towards the wafer holder 201.

In certain embodiments of the present disclosure, the thickness (or thinness) of the wafer holder 201 may be configured so that the heat capacity of the wafer holder 201 may be much lower than a conventional hotplate. For example, the wafer holder 201 may be substantially thinner than a conventional hotplate. The wafer holder 201 may also be made of materials with desired low heat capacity. Thus, heating or cooling the disclosed wafer holder 201 may be substantially faster than a conventional hotplate.

Specifically, the thermal treatment chamber may include a frame body or frame 200. The frame 200 can include a base and sidewalls. The sidewalls may be fixed on the base. Space may be formed between the sidewalls such that the wafer holder 201, the heat reservoir 204, and the first driving unit 207 may be positioned in the formed space.

The wafer holder 201 may be used to hold the wafer being heated or thermally treated. The wafer holder 201 can absorb thermal radiation from the heat reservoir 204 so the temperature of the wafer holder 201 can rise according to a set value in order to heat up the wafer placed on the wafer holder. The disclosed thermal treatment chamber may be designed for the thermal treatment of the spin-on photoresist on the wafer. However, it should be noted that the thermal treatment chamber can also be used for the thermal treatment of other materials or for other fabrication processes.

In one embodiment, the wafer holder 201 may be fixed on the sidewalls of the frame 200. During a fabrication process, the wafer holder 201 may be fixed with respect to the frame 200.

A supporting thimble (not shown) may be included in the wafer holder 201. The supporting thimble can move up and down to raise the wafer to be processed from the wafer holder 201 after a thermal treatment is complete (so the wafer to be processed may be suspended above the wafer holder 201). The support thimble can also place the wafer to be processed on the wafer holder 201 after receiving the wafer (so the wafer to be processed may be placed on the wafer holder 201) from the outside environment, e.g., a wafer transportation unit. A supporting thimble can enable rapid wafer exchange between the thermal treatment chamber and the wafer transportation unit to improve processing speed.

The wafer holder 201 may be made of suitable materials with low heat capacity such that the wafer holder 201 may be warmed up and/or cooled down more rapidly. In the embodiment, the wafer holder 201 may be made of a metal, such as copper and/or aluminum.

The wafer holder 201 may have a surface isolation film (not shown) to prevent metal contamination caused by metal atoms transferred from the surface of the wafer holder 201 to the wafer to be processed.

The isolation film may be made of ceramics, such as aluminum oxide, silicon, and/or silicon dioxide. The thickness of the isolation may be from about 100 nm to about 1000 nm. Preferably, the film is not undesirably thick to adversely affect efficient heat transfer from the wafer holder 201 to the wafer to be processed.

The wafer holder may further include temperature sensing units 203 to detect real-time temperature of the wafer holder 201. There may be a plurality (e.g., greater than 2) of the temperature sensing units 203, distributed uniformly in the wafer holder 201. A temperature sensing unit 203 may include a temperature sensor to convert temperature to electrical signals.

The heat reservoir 204 may be located under the wafer holder 201 to provide thermal treatment to the wafer holder 201. In one embodiment, the heat reservoir 204 may not need to have direct contact with the wafer holder 201, and the heat reservoir 204 may heat up the wafer holder 201 by thermal radiation.

The heat reservoir 204 may be a radiant heat source, such as an electric heating wire. The heat reservoir 204 may also include temperature sensing units to detect the temperature of the heat reservoir 204.

Figure 4:
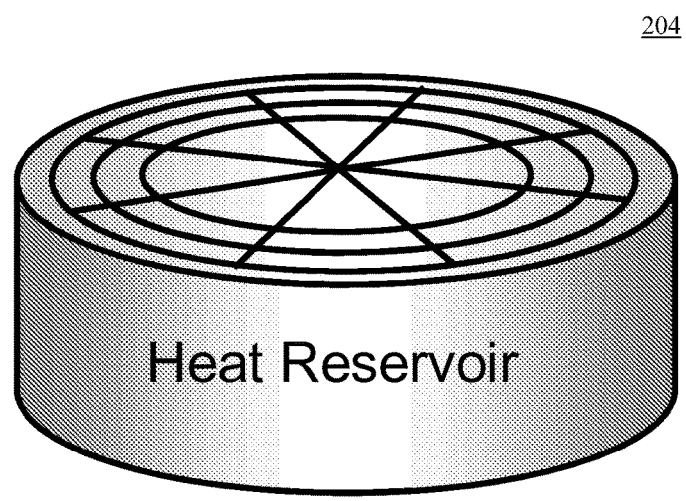
FIG. 4 illustrates an exemplary heat reservoir consistent with the present disclosure.

In certain embodiments, as shown in FIG. 4, the heat reservoir 204 may include a plurality of temperature zones with individually adjustable heaters so that radiation can have improved uniformity with calibration. The temperature zones are illustrated by the areas divided by the circles and straight lines across the surface of the heat reservoir 204. For example, if the temperatures of two or more temperature zones are different, the temperature sensing units on the temperature zones may detect the temperature (i.e., real-time temperature) of each zone and send the temperature information to a control unit. The control unit may then output control signals (or action signals) based on the difference between the real-time temperature and the set temperature value to adjust (e.g., increase or decrease) the heating of each temperature zone separately such that the overall temperature of the heat reservoir may uniformly reach the set temperature.

The heat reservoir 204 may have a same shape as the wafer holder 201. The heat reservoir 204 may also be slightly smaller (or larger) in size than the wafer holder 201 or have a same size as the wafer holder 201 to provide uniform heating to the wafer holder 201.

The heat reservoir 204 may be connected to a first driving unit 207. Driven by the first driving unit 207, the heat reservoir 204 may be moved away from the wafer holder 201 to decrease the temperature of the wafer holder 201, or move towards the wafer holder 201 to increase the temperature of the wafer holder 201. The temperature of the wafer holder 201 may be increased/decreased to a set temperature value. Thus, besides directly changing the temperature of the heat reservoir 204 to increase or decrease the temperature of the wafer holder 201, adjusting the distance between the heat reservoir 204 and the wafer holder 201 may also obtain rapid control/adjustment over the temperature of the wafer holder 201. Thus, the time for temperature adjustment may be shortened.

Specifically, the following operations on the heat reservoir 204 may be used to control the temperature of the wafer holder 201. When the real-time temperature of the wafer holder 201 (the real-time temperature of the wafer holder 201 detected by the temperature sensing units 203) is higher than the set temperature value (the temperature required for the thermal treatment of the wafer), the heat reservoir 204 may start cooling down and moving away from the wafer holder 201 (moving downward). When the real-time temperature of the wafer holder 201 is lower than the set temperature value, the heat reservoir 204 may start warming up and moving towards the wafer holder 201 (moving upward). The movements of moving upward and moving downward are illustrated by the double-headed arrows in FIG. 2.

The first driving unit 207 may include a connecting unit 205 and a driver 206. The driver 206 may be fixed on the frame 200 and provide power for moving the heat reservoir 204. The connecting unit 205 may be used to connect the heat reservoir 204 and the driver 206, and guide the moving direction (indicated by the double-headed arrow in FIG. 3) of the heat reservoir 204.

In an embodiment, the connecting unit 205 may be a slide/guide rail, and the driver 206 may be a piston. The slide rail may include a fixed portion and a movable portion, where the movable portion can move up and down along a direction confined by the fixed portion. The fixed portion and the movable portion may be connected by linear bearings, such as ball bearings and/or roller bearings. The fixed portion may be fixed on a sidewall of the frame 200. One end (i.e., the upper end) of the movable portion may be connected with the heat reservoir 204 through fixed connections, and the other end (i.e., the lower end) of the movable part may be connected with the driver 206 (e.g., a piston) through fixed connections. When the driver 206 (e.g., a piston) is moving back and forth, i.e., pushing forward and retreating back, the movable portion connected to the cylinder may move up and down. The movement of the movable portion may drive the heat reservoir 204 to move up and down accordingly.

In another embodiment, the connecting unit 205 may be a lead screw, and the driver 206 may be a motor. When the lead screw is spinning, the movable portion of the lead screw can move up and down along a direction confined by the thread on the lead screw. The heat reservoir 204 may be connected to the movable portion through fixed connections. One end of the lead screw may be coupled to the motor. When the motor is spinning, the motor may drive the lead screw to spin, and the lead screw may drive the movable portion to move up and down. The movement of the movable structure may drive the heat reservoir 204 to move up and down accordingly. By controlling the moving/spinning direction of the motor, the moving direction of the movable portion may be controlled.

The thermal treatment chamber may further include an isolation unit 202, e.g., a switchable shutter, positioned between the wafer holder 201 and the heat reservoir 204. The isolation unit 202 may isolate thermal radiation on the wafer holder 201 from the heat reservoir 204.

When the wafer holder 201 needs to be cooled down to reach the set temperature value, the isolation unit 202 may isolate the thermal radiation on the wafer holder 201 from by the heat reservoir 204. The heat isolation may shorten the time to cool down the wafer holder 201 to the set temperature value.

The surface area of the isolation unit 202 can have a larger size than the surface area of the heat reservoir 204. The isolation unit 202 may be a circular board/plane, and may be made of suitable materials such as metal.

The isolation unit 202 may be connected to a second driving unit 209. The second driving unit 209 may be connected to a control unit to receive certain control signals for driving the movement of the isolation unit 202. It should be noted that the movement in the present disclosure may represent moving the isolation unit 202 along a plane parallel to the surface of the wafer holder 201.

The second driving unit 209 may drive the isolation unit 202 to provide heat isolation according to suitable control signals from the control unit. When the control unit determines heat isolation is required, the control unit may send certain control signals to the second driving unit 209, and the second driving unit 209 may drive the isolation unit 202 to move under the wafer holder 201 (e.g., close the shutter). The isolation unit 202 may isolate or block heat radiation from the heat reservoir 204 and thus the wafer holder 201 may receive less or no heat from the heat reservoir 204. When the control unit determines heat isolation is not required, the control unit may send certain control signals to the second driving unit 209, and the second driving unit may drive the isolation unit 202 to move away from the space under the wafer holder 201 (e.g., open the shutter). The isolation unit 202 may enable heat radiation from the heat reservoir 204 to reach the wafer holder 201 and thus the wafer holder 201 may receive heat from the heat reservoir 204.

The thermal treatment chamber may further include air cooling control units 208 surrounding the wafer holder 201 to transport a cooling gas to air cool the wafer holder 201.

The time for the wafer holder 201 to be cooled down may be further shortened by transporting a cooling gas through the air cooling control units 208. The cooling gas may be an inert gas, such as nitrogen and/or helium, to protect the wafer holder 201 from being oxidized under a high temperature. In certain other embodiments of the present disclosure, the cooling gas may be air.

The temperature of the cooling gas may be about 20 to about 40 degrees Celsius. Cooling gas used in a clean room, for example, with a temperature of about 22 to about 30 degrees Celsius, may be used as the cooling gas to reduce manufacturing cost. The flow rate of the cooling gas may vary from about 100 sccm (standard cubic centimeters per minute) to about 5000 sccm according to various embodiments.

The air cooling control units 208 each may include a plurality of cooling air inlets 2081. The cooling air inlets 2081 may be fixed on the sidewalls of the frame 200 surrounding the wafer holder 201 (as shown in FIG. 3).

The cooling air inlets 2081 may be fixed on the sidewalls of the frame 200, between the isolation unit 202 and the wafer holder 201. The air cooling control units 208 may transport the cooling gas through the cooling air inlets 2081 to cool down the wafer holder 201 and the isolation unit 202 simultaneously.

After the air cooling control units 208 cools down the wafer holder 201 and the isolation unit 202 by transporting cooling gas to the thermal treatment chamber, the waste gas used for cooling may be vented by an exhaust unit 211 above the wafer holder 201.

In some embodiments of the present disclosure, the air cooling control units 208 may include gas exhaust tubes 2082 located on the sidewalls of the frame 200, as shown in FIG. 2. The gas exhaust tubes 2082 may be located in a direction facing the cooling air inlets 2081 such that the cooling gas transported by the cooling air inlets 2081 may be exhausted through the gas exhaust tubes 2082 after the cooling gas cools down the wafer holder 201 and the isolation unit 202. For illustrative purposes, FIG. 2 illustrates exemplary positions of the cooling air inlets 2081 and the gas exhaust tubes 2082. The specific positions of the cooling air inlets 2081 and the gas exhaust tubes 2082 may also switch or have other arrangement, and are not limited by the embodiments.

As shown in FIG. 3, the thermal treatment chamber may further include an exhaust unit 211 above the wafer holder 201 to exhaust the gas in the thermal treatment chamber.

An air exhaust system in the manufacturing facility or a pump may be used to provide power to the exhaust unit 211.

The exhaust unit 211 may be connected to a third driving unit (not shown). The third driving unit can drive the exhaust unit 211 to move downward to contact the sidewalls of the frame 200 to form a closed space above the wafer holder 201.

Referring to FIG. 2, the thermal treatment chamber may further include a control unit 210 to receive the real-time temperature (i.e., temperature data) detected by temperature sensing units 203. The control unit 210 may then output control signals (or action signals) based on the difference between the real-time temperature and the set temperature value.

The control unit 210 may include a processor, a random access memory (RAM) unit, a read-only memory (ROM) unit, a storage unit, a display, an input/output interface unit, a database; and a communication interface. Other components may be added and certain devices may be removed without departing from the principles of the disclosed embodiments.

The control signals may be used to control or as adjusting signals for the first driving unit 207, moving signals for the second driving unit 209, and cooling signals for the air cooling control unit 208.

The adjusting signals may include a "lowering" signal to control the first driving unit 207 for driving the heat reservoir 204 to move away from the wafer holder 201, and a "rising" signal to control the first unit 207 for driving the heat reservoir 204 to move towards the wafer holder 201.

The moving signals may include a "switch-out" signal to control the second driving unit 209 to drive the isolation unit 202 to switch out from the space under the wafer holder 201, and a "switch-in" signal to control the second driving unit 209 to drive the isolation unit 202 to switch into the space under the wafer holder 201.

The cooling signals may include a "gas-on" signal to control the air cooling control units 208 to start transporting the cooling gas into the thermal treatment chamber, and a "gas-off" signal to control the air cooling control units 208 to stop transporting the cooling gas into the thermal treatment chamber.

In certain embodiments, the control unit 210 may direct adjust (i.e., increase or decrease) the temperature of the heat reservoir 204 based on the real-temperature of the wafer holder 201. In certain other embodiments, the control unit 210 may adjust the temperature of the heat reservoir 204 through controlling the first driving unit 207, the second driving unit 209, and/or the air cooling control units 208. The adjustment described above may or may not be performed simultaneously.

Specifically, the control unit 210 may receive a real-time temperature and output an adjusting signal based on the difference between the real-time temperature and the set temperature value to the first driving unit 207. The first driving unit 207 may receive the adjusting signal and adjusts the distance between the heat reservoir 204 and the wafer holder 201.

The adjustments determined by the difference between the real-time temperature and the set temperature value may include two processes. When the real-time temperature deducted by the set temperature value yields a positive value, the control unit 210 may output a "lowering" control signal. The first driving unit 207 may receive the "lowering" control signal and drive the heat reservoir 204 to move away from the wafer holder 201. When the real-time temperature deducted by the set temperature value yields a negative value, the control unit 210 may output a "rising" control signal. The first driving unit 207 may receive the "rising" control signal and drives the heat reservoir 204 to move towards the wafer holder 201.

When the real-time temperature of the wafer holder 201 is lower than the set temperature value, the air cooling control unit 208 can turn off the cooling gas transportation in the heating process, and the isolation unit 202 may also not be used to provide heating isolation between the heat reservoir 204 and the wafer holder 201.

When the real-time temperature of the wafer holder 201 is higher than the set temperature value, the air cooling control units 208 may turn on the cooling gas transportation in the cooling process, and the isolation unit 202 may be used to provide heating isolation between the heat reservoir 204 and the wafer holder 201. Specifically, when the real-time temperature deducted by the set temperature value yields a positive value, the control unit 210 may output a "switch-in" signal to the second driving unit 209, and the second driving unit 209 may drive the isolation unit 202 to switch into the space under the wafer holder 201. Meanwhile, the control unit 210 may output a "gas-on" signal to the air cooling control units 208 to start transporting the cooling gas to the thermal treatment chamber. When the real-time temperature reaches or approaches the set temperature value, the control unit 210 may send a "switch-out" signal to the second driving unit 209, and the second driving unit 209 may drive the isolation unit 202 to switch/move out from the space under the wafer holder 201. Meanwhile, the control unit 210 can output a "gas-off" signal to the air cooling control units 208 to stop transporting the cooling gas to the thermal treatment chamber.

In another embodiment of the present disclosure, when cooling down the wafer holder 201, adjustment by the air cooling control units 208 (i.e., transporting cooling gas) may be started or stopped at a same time with the adjustment by the isolation unit 202 (i.e., providing thermal isolation). The adjustment by the air cooling control units 208 may also be started or stopped at a different time than the adjustment by the isolation unit 202. For example, one adjustment may start before the other adjustment starts, or one adjustment may end before the other adjustment starts.

In another embodiment of the present disclosure, when cooling down the wafer holder 201, only one adjustment is applied. That is, the wafer holder 201 may be cooled down by transporting the cooling gas through the cooling units 208, or by providing thermal isolation through the isolation unit 202.

Another aspect of the present disclosure provides a method for using the disclosed thermal treatment chamber.

To provide thermal treatment using the thermal treatment chamber described above, the following steps may be included.

Firstly, as shown in FIG. 3, a thermal treatment chamber may be provided. The thermal treatment chamber may include a wafer holder 201 to hold the wafer to be thermally treated in place, and a heat reservoir 204 positioned under the wafer holder 201 to heat up the wafer holder 201. The thermal treatment chamber may also include a first driving unit 207 connected to the heat reservoir 204 to drive the heat reservoir 204 to move towards or move away from the wafer holder 201.

Further, before the thermal treatment, the temperature of the wafer holder 201 may be set to a desired value to meet suitable fabrication standards.

In practice, since the required temperature for the wafer holder 201 may vary according to different types of photoresist and fabrication processes (the variation range may be up to tens of degrees Celsius or hundreds of degrees Celsius), the temperature of the wafer holder 201 may need to be adjusted when switching from one type of photoresist/fabrication process to another type of photoresist/fabrication process.

When the real-time temperature of the wafer holder 201 (the temperature detected by the temperature sensing units 203) is higher than the set temperature value (the temperature required for the thermal treatment for the wafer), the temperature of the heat reservoir 204 can start decreasing, and the heat reservoir 204 may be driven to move away from the wafer holder 201 (moving downward). Meanwhile, the air cooling control units 208 can start transporting cooling gas into the thermal treatment chamber, and the isolation unit 202 may be switched into the space under the wafer holder 201 in order to isolate thermal radiation generated by the heat reservoir 204. Thus, the time for the wafer holder 201 to be cooled down may be greatly shortened.

When the real-time temperature of the wafer holder 201 (the temperature detected by the temperature sensing units 203) is lower than the set temperature value (the temperature required for the thermal treatment for the wafer), the control unit 210 may control the temperature of the heat reservoir 204 to increase, and the control unit 210 may drive the heat reservoir 204 to move towards the wafer holder 201 (moving upward). Meanwhile, the control unit 210 may control the second driving unit 209 to move the isolation unit 202 away from the space under the wafer holder 201 such that heat radiation from the heat reservoir 204 may reach the wafer holder 201 to increase the temperature of the wafer holder 201. Thus, the time for heating up the wafer holder 201 to the set temperature may be greatly shortened.

In certain embodiments, the set temperature of the wafer holder 201 may be set to be between about 50 to about 450 degrees Celsius, and the temperature of the heat reservoir 204 may be between about 300 to about 600 degrees Celsius.

Further, a wafer 21 to be thermally treated/processed may be provided and placed on the wafer holder 201. The wafer 21 to be processed may include a photoresist layer on the surface. The photoresist layer may be formed in the coating chamber by spinning photoresist on the wafer 21.

Further, the difference between the real-time temperature and the set temperature value of the wafer holder 201 may be obtained to drive the heat reservoir 204 to move away from or move towards the wafer holder 201 until the real-time temperature matches the set temperature value.

Since the temperature of the wafer 21 may be substantially the same as the environmental temperature (about 22 to about 25 degrees Celsius) in the coating apparatus, the temperature of the wafer holder 201 may be lower than the temperature of the wafer holder 201 in the thermal treatment chamber. As a result, when the wafer 21 is loaded on the wafer holder 201, the wafer 21 may cause the temperature of the wafer holder 201 to decrease, and the temperature of the wafer holder 201 may deviate from the set temperature value. This temperature deviation, if not adjust promptly, may adversely affect the accuracy of the thickness and the uniformity of the surface features of the photoresist layer.

In some embodiments of the present disclosure, when the wafer 21 to be processed is placed on the wafer holder 201, the difference between the real-time temperature of the wafer holder 201 and the set temperature value may be obtained by the control unit 210. The control unit 210 may drive the heat reservoir 204 to move away from or move towards the wafer holder 201 until the real-time temperature matches the set temperature value. Thus, the difference between the real-time temperature and the set temperature value may be eliminated in a shortest time, and the accuracy of the thickness and the uniformity of the surface features of the photoresist layer may be improved.

Specifically, before the wafer 21 is placed on the wafer holder 201, the heat reservoir 204 may be positioned at a first position when the wafer holder 201 reaches the set temperature value. After the wafer 21 is placed on the wafer holder 201, when the temperature of the wafer holder 201 deducted by the set temperature value yields a negative value, the control unit 210 may drive the heat reservoir 204 to move towards the wafer holder 201, move away from the wafer holder 201, and move back to the first position.

To heat up the wafer holder 201 to the set temperature value in a shortened time, the heat reservoir 204 may be first driven to move towards the wafer holder 201. When the difference between the real-time temperature of the wafer holder and the set temperature value becomes sufficiently small, the control unit 210 may drive the heat reservoir 204 to move away from the wafer holder 201 and move back to the first position. When the heat reservoir 204 moves, the distance between the heat reservoir 204 and the wafer holder 201 may vary, and the temperature of the wafer holder 201 may continue to rise after it reaches the set temperature value. The temperature of the heat reservoir 204 may be maintained constant when moving.

In certain other embodiments, after the wafer 21 is placed on the wafer holder 201, when the temperature of the wafer holder 201 deducted by the set temperature value yields a positive value, the control unit 210 may drive the heat reservoir 204 to move away from the wafer holder 201, move towards the wafer holder 201, and move back to the first position. When the difference between the real-time temperature of the wafer holder and the set temperature value becomes sufficiently small, the control unit 210 may drive the heat reservoir 204 to move towards the wafer holder 201 and move back to the first position. When the heat reservoir 204 moves, the distance between the heat reservoir 204 and the wafer holder 201 may vary, and the temperature of the wafer holder 201 may continue to decrease after it reaches the set temperature value. The temperature of the heat reservoir 204 may be maintained constant when moving.

In the disclosure, because the temperature of the heat reservoir 204 is much higher than the temperature of the wafer holder 201, the heating of the wafer holder 201 can be substantially faster compared to a conventional hotplate. Also, the isolation unit 202, the air cooling control units 208, and the low heat capacity of the wafer holder 201 may enable the temperature of the wafer holder 201 to be increased and decreased faster as well. Thus, the disclosed method provides a substantially higher temperature changing speed.

Compared with an existing thermal treatment chamber or hotplate, the method provided by the present disclosure has several advantages. The disclosed thermal treatment chamber includes a wafer holder and a heat reservoir located under the wafer holder. Driven by a first driving unit, the heat reservoir may move away from or move towards the wafer holder such that increasing or decreasing the temperature of the wafer holder may be obtained not only by adjusting the temperature of the heat reservoir, but also by adjusting the distance between the heat reservoir and the wafer holder. Thus, the time to increase or decrease the temperature of the wafer holder may be greatly shortened.

Further, the thermal treatment chamber also includes an isolation unit. When the temperature of the wafer holder is being decreased to the set temperature value, the isolation unit may isolate thermal radiation generated by the heat reservoir on the wafer holder. The time to decrease the temperature of the wafer holder to the set temperature value may be much shortened.

Further, the thermal treatment chamber also includes air cooling control units distributed around the wafer holder to transport cooling gas to air cool the wafer holder. The cooling of the wafer holder may be greatly accelerated by the cooling gas transported by the air cooling control units.

In the thermal treatment method provided in the disclosure, after the wafer to be processed is placed on the wafer holder, the difference between the temperature of the wafer holder and the set temperature value may be obtained. Controlled by a control unit, the first driving unit drives the heat reservoir to move towards or move away from the wafer holder until the real-time temperature of the wafer holder reaches the set temperature value. Thus, the difference between the real-time temperature and the set temperature value may be eliminated in a shortest time, and the accuracy of the thickness and the uniformity of the surface features of the photoresist layer may be improved.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims.

What is claimed is:

1. A thermal treatment method, comprising:
providing a thermal treatment chamber having a wafer holder to hold a to-be-processed wafer, a heat reservoir positioned under the wafer holder but separated from the wafer holder for adjusting a temperature of the wafer holder, and a first driving unit connected to the heat reservoir for adjusting a distance between the wafer holder and the heat reservoir to adjust the temperature of the wafer holder;
setting a temperature of the wafer holder to be a set temperature value;
placing the to-be-processed wafer on the wafer holder;
obtaining a real-time temperature of the wafer holder after the to-be-processed wafer is placed on the wafer holder; and
obtaining a difference between the real-time temperature of the wafer holder and the set temperature value for adjusting the distance between the heat reservoir and the wafer holder until the real-time temperature is equal to the set temperature value, wherein:
the thermal treatment chamber further includes a frame having a base and sidewalls,
the sidewalls are fixed on the base to form space such that the wafer holder, the heat reservoir, and the first driving unit are positioned in the space,
the first driving unit includes a driver and a connecting unit, the driver being fixed on the base for driving the heat reservoir moving up and down, and the connecting unit being connected to the heat reservoir and the driver to guide a movement direction of the heat reservoir, and
the connecting unit includes a fixed portion and a movable portion, the fixed portion being fixed on a sidewall of the frame, and the movable portion being connected to the heat reservoir and the driver to guide the movement direction of the heat reservoir along directions confined by the fixed portion.

2. The thermal treatment method according to claim 1, wherein:
the thermal treatment chamber further includes a control unit to receive the real-time temperature and send a control signal to the first driving unit based on the difference between the real-time temperature and the set temperature value.

3. The thermal treatment method according to claim 2, wherein:
the isolation unit is placed between the wafer holder and the heat reservoir for allowing heat radiation on the wafer holder from the heat reservoir by moving out of a space between the wafer holder and the heat reservoir and preventing heat radiation on the wafer holder from the heat reservation by being positioned between the wafer holder and the heat reservoir.

4. The thermal treatment method according to claim 3, wherein:
the second driving unit is connected to the control unit and the isolation unit for driving the isolation unit to move out of the space between the wafer holder and the heat reservoir when heat radiation from the heat reservoir is needed and to move into the space between the wafer holder and the heat reservoir when heat radiation from the heat reservoir is not needed.

5. The thermal treatment method according to claim 1, wherein:
the thermal treatment chamber further includes air cooling control units distributed around the wafer holder for transporting a cooling gas to air cool the wafer holder, wherein the cooling gas is an inert gas, air, or a combination of an inert gas and air.

6. The thermal treatment method according to claim 5, wherein:
each of the air cooling control units has a plurality of air inlets distributed uniformly around the wafer holder.

7. The thermal treatment method according to claim 1, wherein:
the thermal treatment chamber further includes temperature sensing units for detecting the real-time temperature of the wafer holder.

8. The thermal treatment method according to claim 2, wherein:
when the real-time temperature deducted by the set temperature value yields a positive value, the control unit outputs a "lowering" control signal such that the first driving unit receives the "lowering" control signal and drives the heat reservoir to move away from the wafer holder.

9. The thermal treatment method according to claim 2, wherein:
when the real-time temperature deducted by the set temperature value yields the negative value, the control unit outputs a "rising" control signal such that the first driving unit receives the "rising" control signal and drives the heat reservoir to move towards the wafer holder.

10. The thermal treatment method according to claim 2, wherein:
the control unit adjusts a temperature of the heat reservoir based on the difference between the real-time temperature and the set temperature value.

11. The thermal treatment method according to claim 1, wherein:
the distance between the wafer holder and the heat reservoir is adjusted by driving the heat reservoir to move towards the wafer holder and to move away from the wafer holder.

12. The thermal treatment method according to claim 1, wherein:
the heat reservoir includes a plurality of temperature zones with individually adjustable heaters.

13. The thermal treatment method according to claim 1, wherein:
the connecting unit includes a slide rail including a fixed portion and a movable portion, the fixed portion and the movable portion being connected by a linear bearing, and
the driver includes a piston.

14. The thermal treatment method according to claim 1, wherein:
the connecting unit includes a lead screw, and
the driver includes a motor.

15. The thermal treatment method according to claim 3, wherein:
a surface area of the isolation unit is larger than a surface area of the heat reservoir, and
the isolation unit includes a circular board.

16. The thermal treatment method according to claim 1, wherein a photoresist layer is formed on a surface of the to-be-processed wafer.

17. The thermal treatment method according to claim 1, wherein:
before the to-be-processed wafer is placed on the wafer holder, the heat reservoir is positioned at a first position when the wafer holder reaches the set temperature value; and
after the wafer is placed on the wafer holder, the real-time temperature deducted by the set temperature value being a negative value, the heat reservoir is driven to move towards the wafer holder, move away from the wafer holder, and move back to the first position.

18. The thermal treatment method according to claim 1, wherein a temperature of the heat reservoir is maintained constant when moving away and back to the first position.

* * * * *